4,590,054

United States Statutory Invention Registration [19]

[11] Reg. Number: H54

[45] Published: Apr. 1, 1986

Hixenbaugh et al.

[54] SOLDERING EXTERNAL LEADS TO FILM CIRCUITS

[75] Inventors: Roy H. Hixenbaugh, Center Valley; Louis W. Kalberman, Whitehall; Delos M. Sutter, Lenhartsville, all of Pa.

[73] Assignee: AT&T Bell Laboratories, Murray Hill, N.J.

[21] Appl. No.: 520,572

[22] Filed: Aug. 5, 1983

[51] Int. Cl.[4] ..... B23K 31/00; B23K 1/08

[52] U.S. Cl. ..... 228/125; 228/40

[58] Field of Search ..... 228/36, 33, 40, 125, 228/180, 260, 39, 259, 128

[56] References Cited

U.S. PATENT DOCUMENTS

| | | | |
|---|---|---|---|
| Re. 30,399 | 9/1980 | Ammonn et al. | 228/180 R |
| 3,605,244 | 9/1971 | Osborne et al. | 29/471.1 |
| 3,705,457 | 12/1972 | Tardoskegyi | 228/36 X |
| 3,713,876 | 1/1973 | Lavric | 228/180 R X |
| 3,874,068 | 4/1975 | Cook | 228/125 |
| 4,315,042 | 2/1982 | Spigarelli | 228/40 X |
| 4,401,253 | 8/1983 | O'Rourke | 228/125 |
| 4,402,448 | 9/1983 | O'Rourke | 228/125 |
| 4,410,126 | 10/1983 | O'Rourke | 228/125 |

OTHER PUBLICATIONS

"Solder Coating and Air Leveling of PC Boards", *Electronic Packaging and Production*, Jul. 1977, pp. 24–31.

*Primary Examiner*—Charles T. Jordan
*Attorney, Agent, or Firm*—Lester H. Birnbaum

[57] ABSTRACT

Disclosed is a method of soldering external leads to film circuits formed on insulating substrates. The leads, usually in the form of lead frames, are clipped onto the substrates and a flux is applied. The assemblies are then immersed into molten solder. As they are withdrawn from the solder, they pass through high-pressure hot gas jets which remove the excess solder.

8 Claims, 8 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SOLDERING EXTERNAL LEADS TO FILM CIRCUITS

BACKGROUND OF THE INVENTION

This invention relates to attaching leads for external electrical connection to metallized substrates, and in particular to a method of solder bonding the leads to the substrates.

In the field of film circuits, components are formed on an insulating substrate which typically comprises ceramic. These components can be in the form of thin and/or thick film devices with associated conductors and bonding pads for connection to outside circuitry. The circuit can further include integrated circuit chips bonded to pads on the substrate to form a hybrid integrated circuit.

In the fabrication of such circuits, an important step is bonding leads to the bonding pads on the substrate to permit external connection. The leads are typically in the form of lead frames which provide a unitary structure including metal fingers addressing one edge (Single In-Line Package) or two edges (Dual In-Line Package) of several substrates. The ends of the leads typically include jaws for clipping onto the substrate pads. However, soldering of the leads is typically required to insure a firm bond between the leads and pads.

A standard method of applying the solder is to deposit a solder paste to the pads by standard screen printing prior to attachment of the leads. After lead attachment, the solder is reflowed to provide the bond. Although generally adequate, this method presents yield problems since the solder paste can chip when the leads are attached, resulting in insufficient solder to provide a good bond, and residual solder balls tend to form on the substrate after solder reflow, producing shorts on certain portions of the circuit. Other methods commonly used, such as providing a solder preform or cladding on the leads, also have a tendency to result in variations in solder thickness at the connection between the leads and bonding pads. A further method, where the substrate and leads are immersed into molten solder, would generally produce variations in the solder thickness on the lead frames. This, in turn, interferes with subsequent forming operations for the leads.

Consequently, it is a primary object of the invention to provide a method of solder bonding external leads to film circuits which results in good control of solder thickness and high yield.

SUMMARY OF THE INVENTION

This and other objects are achieved in accordance with the invention which is a method of bonding leads to metal pads on an insulating substrate. The leads are attached to respective pads on the substrate. The assembly is then immersed in a bath comprising molten solder to form solder at least in the areas of the pads and leads. The assembly is removed from the bath and a plurality of hot-air jets are applied thereto to remove excess solder.

BRIEF DESCRIPTION OF THE DRAWINGS

These and other features of the invention are delineated in detail in the following description. In the drawings.

It will be appreciated that for purposes of illustration, these figures are not necessarily drawn to scale.

DETAILED DESCRIPTION

Figure 1:
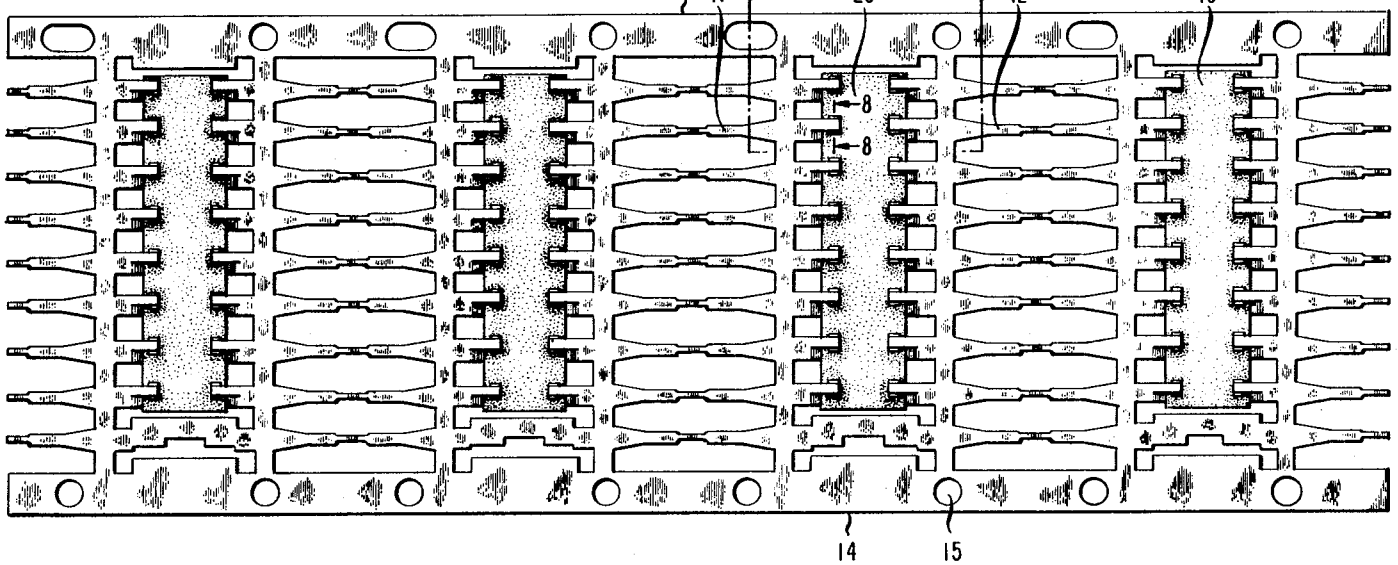
FIG. 1 is a top view of a typical substrate and lead assembly which may be utilized in the present invention.
Figure 2:
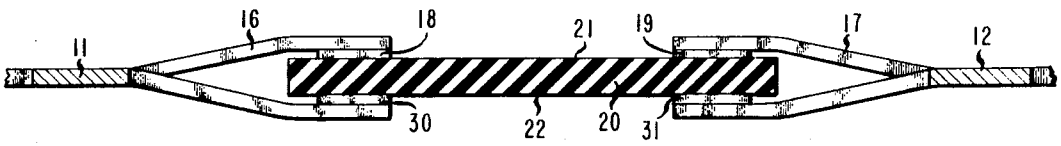
FIG. 2 is a cross-sectional view of a portion of the assembly in FIG. 1.

FIG. 1 illustrates a portion of a typical workpiece which may be soldered in accordance with the invention. Shown is a typical lead frame, 10, including metal fingers or leads, such as 11 and 12, extending from both edges of substrates, such as 20 and 40, and mechanically cross-coupled to two end bars, 13 and 14. The bars include indexing holes, such as 15, which could become clogged if too much solder is left on the lead frame. As illustrated in FIG. 2, which is a cross-sectional view along 2–2', the ends of each lead are formed into jaws, 16 and 17, which permit the leads to be clipped onto respective bonding pads, 18, 30 and 19, 31, formed on the front and back surfaces, 21 and 22, of an insulating substrate, 20. In this example, the substrates, 20 and 40, comprise alumina and the pads, 18, 19, 30, and 31, comprise a mixture of Pt, Pd, and Ag. The substrates also include typical thick film resistors and metal interconnections formed on the front surface to form standard thick film circuits. (Circuit elements may also be included on the back surface.) For the sake of clarity in the illustration, these elements are not shown. It will also be appreciated that although only four substrates are shown in FIG. 1, the entire assembly typically includes 10 or more substrates attached to the lead frame. The leads, 11 and 12, are typically made of copper alloy.

Figure 3:
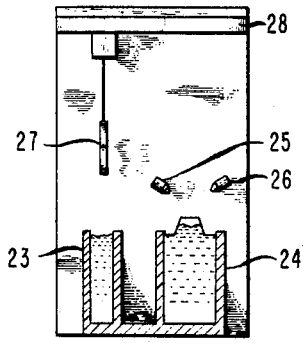
FIGS. 3–7 are schematic cross-sectional views of an apparatus illustrating various steps in accordance with one embodiment of the invention.
Figure 4:
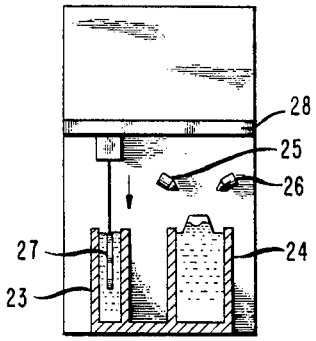
Figure 5:
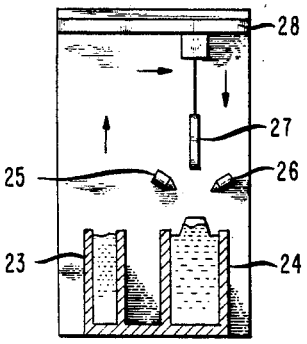
Figure 6:
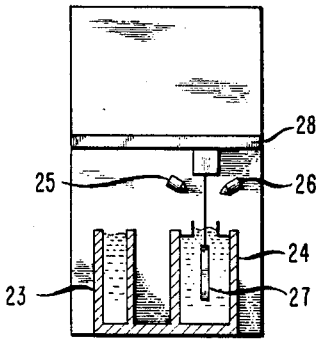

After the leads are clipped to the substrates, the bonding may be accomplished by the sequence of steps shown in FIGS. 3–7. Illustrated in FIG. 3 is a fixture, 27, which can include a plurality of assemblies shown in FIG. 1. The fixture is coupled to some conveyor means, 28, which is mounted so as to permit vertical and horizontal motion of the fixture. Beneath the conveyor means are two pots. One pot, 23, includes a flux such as a water-soluble activated flux made by London Chemical Company and sold under the designation Lonco 330, while the second pot, 24, includes a molten solder such as a mixture of 59.5 percent by weight Sn, 38.5 percent by weight Pb, and 2 percent Ag. Mounted above the solder pot are a pair of nozzles, 25 and 26, which are positioned to direct high pressure fluid jets toward the front and back surfaces of the substrates and leads. The nozzles typically have openings measuring approximately 0.012"×18" so that one nozzle can cover the surfaces of approximately 20 assemblies. Nozzle 25 is positioned to be at a distance of 5/32 inches from the lead frame when the assembly passes therethrough, and nozzle 26 is at a distance of ⅜ inches. If desired, more than two nozzles might be used. The nozzles are also typically positioned at an angle of approximately 95° with the substrate surfaces in order to aid in driving the solder back into the pot when the fixture is removed. The nozzles could also be positioned horizontally (90°) as well as at other angles. Some means (not shown) are included to form waves, such as 32, in the solder to avoid oxidation at the surface. It will be appreciated that only basic features of the apparatus are illustrated for purposes of describing the invention. The actual equipment employed was a commercially available solder leveling apparatus sold by Electrovert USA Corp. under the designation Model 08 Levelair TM. As shown in FIG. 4, the fixture containing the substrate-lead frame assemblies is lowered into the pot, 23, containing the fluxing material. Typically, the assemblies will be immersed for 1 second, but a range of 1–6 seconds could be utilized. The assemblies are removed from the flux and, as shown in FIG. 5, transported to the area above the solder pot, 24. The conveyor means is then lowered, as shown in FIG. 6, to immerse the fixture containing the assemblies into the solder. In this example, the solder has been heated to a temperature of 240° C. so that it will be molten prior to immersion of the assemblies. A useful temperature range for this particular solder is 230° C.—250° C. The assemblies are typically immersed for approximately 4 seconds, but a useful range would be 2–6 seconds.

Figure 7:
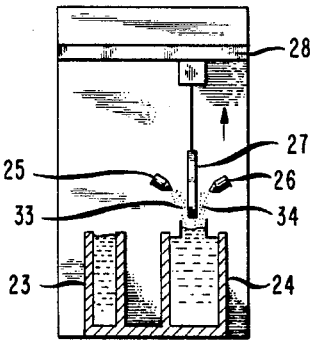

Next as illustrated in FIG. 7, the fixture is withdrawn from the solder. During this step, the assemblies are passed through the nozzles, 25 and 26, each of which directs a jet of hot gas, illustrated as lines 33 and 34, toward one of the major surfaces of the substrates. In this example, nozzle, 25, directs a jet, 33, of hot air at a pressure of approximately 16 psi at the front surface of the substrates (21 of FIG. 2), while nozzle, 26, directs a jet, 34, of hot air at a pressure of approximately 14 psi toward the back surface of the substrate (22 of FIG. 2). The withdrawal rate in this example is approximately 56 ft/min. The jet pressures and withdrawal speed will control the thickness of the solder at the joints and on the lead frames, and can therefore be varied for particular needs. A recommended pressure for the front nozzle, 25, is 12–20 psi and that for the back nozzle, 26, is 10–18 psi. If the pressures are too low, excess solder will be left on the assemblies, while if they are too high, solder will be blown out of the areas of the lead-bonding pad interfaces where the solder is needed to form a good joint. A recommended withdrawal rate is 40–65 ft/min. If the withdrawal rate is too fast, excess solder will be left on the assemblies. Too slow a withdrawal rate will result in too much removal of solder, as well as an excessive immersion time which could cause leaching of the Pt-Pd-Ag pads. The temperature of the air jets in this example was approximately 230° C. The temperature is chosen so as to keep the solder molten. However, the temperature should not be so high as to result in dissolution of the Pt-Pd-Ag pads. A preferred range is 220° C.–250° C. It will be appreciated that, although air is used in this example, other gases could be used for the jets. Nitrogen and mixtures of hydrogen and nitrogen (3–5 percent $H_2$ and the rest $N_2$) could be employed, for example.

Figure 8:
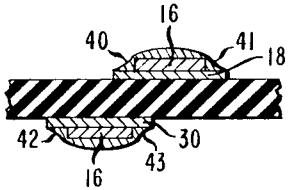
FIG. 8 is a cross-sectional view of a portion of the assembly of FIG. 1 subsequent to the steps illustrated in FIGS. 3–7.

FIG. 8 illustrates a portion of the assembly of FIG. 1, but after the leads have been soldered according to the above-described method. It will be noted that solder fillets, 40, 41, 42, and 43, have been formed around each lead-bonding pad interface, indicating a well-formed solder joint.

Leads attached to thick film circuits in accordance with the above example were tested for pull strength. The median value of such pull strengths in a typical run including 80 leads was approximately 9 lbs, and the minimum was approximately 5.6 lbs, which was superior to a typical run of leads attached by reflow of solder paste, where the median was 8 lbs and the minimum was 3.0 lbs. This improved pull-strength is apparently due to the fact that flux volatiles are not trapped in the solder when the present technique is employed and, consequently, formation of voids is minimized. Further, no solder balls are formed, as is usually the case when solder paste methods are employed.

Although the method has been described for use with thick film resistor circuits, it should be appreciated that it may be employed for lead attachment on any circuit which is capable of withstanding immersion in molten solder.

Various additional modifications will become apparent to those skilled in the art. All such variations which basically rely on the teachings through which the invention has advanced the art are properly considered within the spirit and scope of the invention.

What is claimed is:

1. A method of bonding leads in the form of a lead frame to metal pads on an insulating substrate comprising:

attaching the leads to respective pads on the substrate to form a substrate-lead frame assembly;

applying molten solder to the assembly to form solder at least in the areas of the pads and leads; and applying a first hot gas jet to the surface of the assembly including the front surface of the substrate and a second hot gas jet to the opposite surface of the assembly to control the thickness of the solder on the lead frames and form a solder fillet at each lead and bonding pad.

2. The method according to claim 1 further comprising the step of applying a flux to the assembly prior to applying the solder bath.

3. The method according to claim 1 wherein the solder comprises approximately 59.5 percent by weight tin, 38.5 percent by weight lead, and 2 percent by weight silver.

4. The method according to claim 1 wherein the gas comprises air.

5. The method according to claim 1 wherein the pressure of the first jet is within the range 12–20 psi, and the pressure of the second jet is in the range 10–18 psi.

6. The method according to claim 1 wherein the assembly is immersed in a both of molten solder and the jets are applied to the assembly as it is withdrawn from the solder, and the withdrawal rate is in the range 40–65 ft/min.

7. The method according to claim 1 wherein the jets are at a temperature in the range 220° C.—250° C.

8. A method of bonding leads in the form of a lead frame to metal pads included in a thick film circuit formed on the front and back surface of an insulating substrate comprising:

attaching the leads to respective pads on the substrate to form a substrate-lead assembly;

immersing the assembly in a first bath including a flux;

immersing the assembly in a second bath comprising molten lead-tin solder to form solder at least in the areas of the pads and leads; and as the assembly is withdrawn from the solder bath, applying hot-air jets to both the front and back surfaces of the substrate to remove excess solder and form a solder fillet at each lead and bonding pad, the pressure of the jet applied to the front surface being in the range 12–18 psi, the pressure of the jet applied to the back surface being in the range 10–18 psi, the withdrawal speed being in the range 40–65 ft/min, and the temperature of the jet being in the range 220° C.–250° C.

* * * * *